(12) United States Patent
Muza

(10) Patent No.: US 6,275,102 B1
(45) Date of Patent: Aug. 14, 2001

(54) DISTORTION CORRECTION LOOP FOR AMPLIFIER CIRCUITS

(75) Inventor: John M. Muza, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/491,543

(22) Filed: Jan. 26, 2000

Related U.S. Application Data

(60) Provisional application No. 60/118,268, filed on Feb. 2, 1999.

(51) Int. Cl.$^7$ .................................................... H03F 1/36
(52) U.S. Cl. ........................................... 330/85; 330/69
(58) Field of Search ............................. 330/69, 85, 149

(56) References Cited

U.S. PATENT DOCUMENTS

| | | | |
|---|---|---|---|
| 3,448,289 | * 2/1971 | Harris | 307/230 |
| 3,566,298 | * 2/1971 | Stevens | 330/84 |
| 4,513,752 | * 4/1985 | Weyant | 128/696 |
| 4,634,996 | * 1/1987 | Gulczynski | 330/261 |

* cited by examiner

Primary Examiner—Robert Pascal
Assistant Examiner—Henry Choe
(74) Attorney, Agent, or Firm—Alan K. Stewart; Wade James Brady, III; Frederick J. Telecky, Jr.

(57) ABSTRACT

The distortion correction circuit includes: a main amplifier 30 having a first resistor 36 coupled from an output of the main amplifier 30 to a first input of the main amplifier 30, and a second resistor 34 coupled between the first input of the main amplifier 30 and a first input signal node; a correction loop amplifier 32 having an output coupled to a second input of the main amplifier 30, an output of the main amplifier 30 coupled to a first input of the correction loop amplifier 32, a second input of the correction loop amplifier 32 coupled to a second input signal node.

7 Claims, 1 Drawing Sheet

DISTORTION CORRECTION LOOP FOR AMPLIFIER CIRCUITS

This application claims priority under 35 USC § 119 (e)(1) of provisional application No. 60/118,268 filed Feb. 2, 1999.

FIELD OF THE INVENTION

This invention generally relates to electronic systems and in particular it relates to analog amplifier circuits.

BACKGROUND OF THE INVENTION

The main distortion source in a power amplifier lies in the output stage. As it supplies the large current variations that the load usually requires, the amplifier open loop gain changes considerably. The main key is the gain of the second stage where the second stage is the output stage. In general feedback theory, as the negative feedback gain that loops around the distortion source increases, the total harmonic distortion (THD) will be reduced by 1+T(w) where T(w) is the loop gain at harmonic frequencies 2w, 3w, etc. Each negative feedback loop around the distortion source has a multiplicative reduction effect.

In a power efficient class AB output stage the current is throttled back as low as possible to save power. In a typical two stage design this implies the second stage gain is severely reduced in a quiescent state and in most power conscience designs the second stage gain is much less than one. This means there is really only one gain loop around the error source rather than two. The low level linearity (actually in a classical two stage class AB design the entire signal range) is severely impaired by driving small impedance loads.

There are many prior art types of multi-stage amps. These are good for THD because of the multi-loops around the output stage. These provide a multiplication reduction by the loop gains for the closed loop THD of the amp. In a three stage amplifier, even though the last stage gain would be impaired, there are still two gain loops rather than one in the previous case. The major drawback of these prior art designs is the amount of power required to keep stability. When a small impedance load is added to the circuit, since the third stage gain is much less than one in a class AB design, the pole associated with the second stage moves down in frequency. Therefore, to compensate this amplifier, the circuit would either have to pump a high quiescent current to boost the transconductance of the third stage of the amplifier to very high levels, or use a high current to boost the transconductance of the second stage of the amplifier to very high levels. This means that two of the three stages have to be power hungry stages. This is not the answer for low idle current applications when driving low impedance loads (50 ohms or less in standard CMOS). Bipolar amplifiers handle this problem better since they have higher transconductance-to-current ratios than MOS, but the concept of the problem remains.

SUMMARY OF THE INVENTION

The distortion correction circuit includes: a main amplifier having a first resistor coupled from an output of the main amplifier to a first input of the main amplifier, and a second resistor coupled between the first input of the main amplifier and a first input signal node; a correction loop amplifier having an output coupled to a second input of the main amplifier, an output of the main amplifier coupled to a first input of the correction loop amplifier, a second input of the correction loop amplifier coupled to a second input signal node.

DETAILED DESCRIPTION OF PREFERRED EMBODIMENTS

Figure 1:
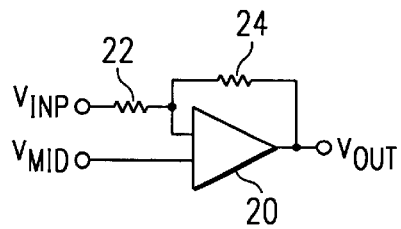
FIG. 1 is a schematic circuit diagram of a typical prior art inverting gain stage.

The preferred embodiment circuits are designed to enable low current (at quiescent) power amplifiers capable of driving very difficult low impedance loads with excellent distortion performance. FIG. 1 shows a typical prior art inverting gain stage. The circuit of FIG. 1 includes two stage amplifier 20, resistors 22 and 24, input signal $V_{INP}$, source reference voltage $V_{MID}$, and output voltage $V_{OUT}$. The following equations describe the operation of the circuit of FIG. 1:

$$V_{OUT} = -V_{INP}(R_2/R_1) + V_{MID}(1+R_2/R_1)$$

$$V_{OUT} = -V_{INP} + 2V_{MID}, \text{ for } R_1 = R_2$$

assuming $$V_{INP} = V_{IN} + V_{MID},$$

where $V_{IN}$ is an AC signal around $V_{MID}$ then $$V_{OUT} = V_{MID} - V_{IN}$$

Where $R_1$ is resistor 22 and $R_2$ is resistor 24.

Figure 2:
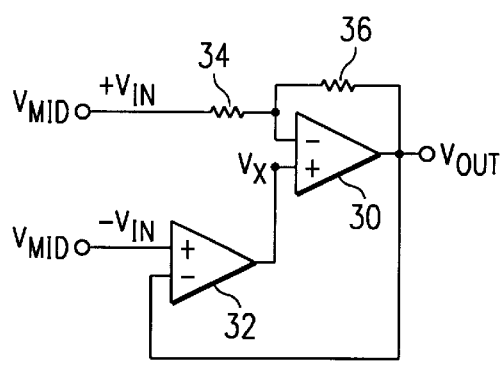
FIG. 2 is a schematic circuit diagram of a preferred embodiment distortion correction circuit.

In the preferred embodiment circuit of FIG. 2, $V_{MID}$ is replaced with $V_X$ which modulates to correct for any imperfections in output voltage $V_{OUT}$ as compared with input signal $V_{IN}$. This manifests itself into an improvement in THD. The circuit of FIG. 2 includes amplifiers 30 and 32, resistors 34 and 36, input signal $V_{MID}+V_{IN}$, input signal $V_{MID}-V_{IN}$, correction signal $V_X$, and output $V_{OUT}$. Correction signal $V_X$ modulates around $V_{MID}$ to try to keep $V_{OUT}$ equal to $-V_{IN}$. The addition of Amplifier 32 and the feed back from $V_{OUT}$ provides a global correction loop to improve the distortion of amplifier 30.

Figure 3:
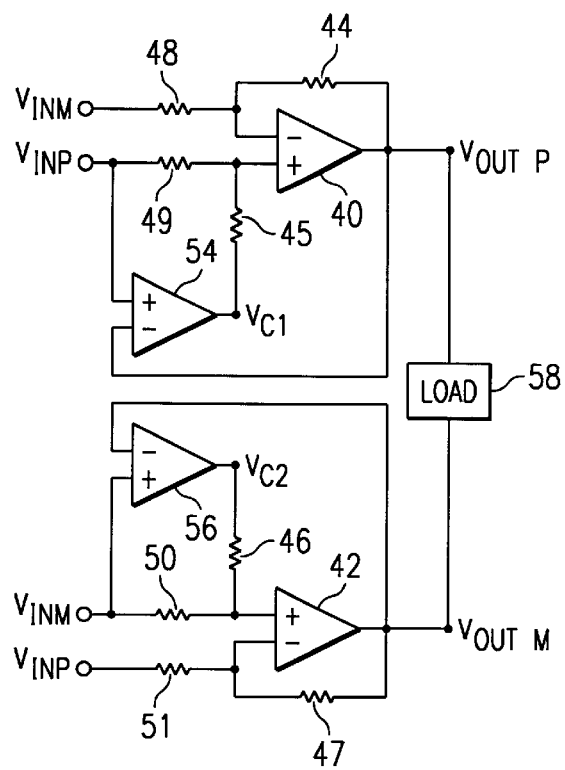
FIG. 3 is a schematic circuit diagram of a first preferred embodiment differential distortion correction circuit.

FIG. 3 shows a first preferred embodiment differential THD loop correction circuit. The circuit of FIG. 3 uses the same technique as the circuit of FIG. 2 to improve the THD. The circuit of FIG. 3 includes main amplifiers 40 and 42, resistors 44–51, input signals $V_{INM}$ and $V_{INP}$, output signals $V_{OUTP}$ and $V_{OUTM}$, loop amplifiers 54 and 56, and output load 58. Resistors 44–47 have the same resistance values. Resistors 48–51 have twice the resistance value of resistors 44–47. In the unity gain differential case as shown in FIG. 3, the loop amplifiers 54 and 56 individually modulate signals $V_{C1}$ and $VC_2$ to correct for the distortion produced by the main amplifiers 40 and 42 driving the difficult low impedance load 58. In the circuit of FIG. 3, the resistance values of resistors 44–51 can be very high. For example, resistors 44–47 can be on the order of 100 K ohms. Therefore, the loop amplifiers 54 and 56 can be very small and very low power because their load requirements are so relaxed. This unity gain configuration is an example. This technique can be used for any gain configuration.

In essence, what is achieved with the circuit of FIG. 3 is an extra negative feedback loop around the output stage with a gain of $A_1*A_2$, where $A_1$ is the gain of main amplifiers 40 and 42 and $A_2$ is the gain of loop amplifiers 54 and 56. The extra feedback loop provides stability without sacrificing power. This is an important improvement over the prior art multi-stage solutions because the prior art solutions significantly increase the power consumption. Any time negative feedback loops are added, the overall stability is still an issue, but for the circuit of FIG. 3, the only thing required is that the bandwidth through the loop amplifiers 54 and 56 be kept a few factors less than the main path.

Figure 4:
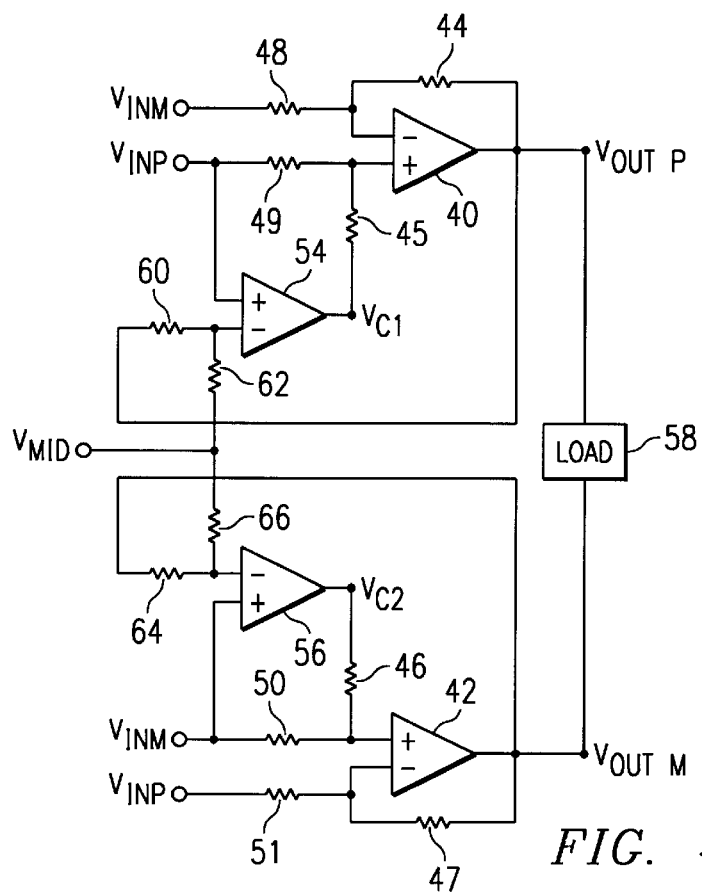
FIG. 4 is a schematic circuit diagram of a second preferred embodiment differential distortion correction circuit.

FIG. 4 shows a second preferred embodiment differential THD loop correction circuit. The circuit of FIG. 4 is the same as the circuit of FIG. 3 with the exception of the addition of resistors 60, 62, 64, and 66, and voltage node $V_{MID}$. Resistors 60 and 62 form a linear voltage divider for $V_{OUTP}$. Resistors 64 and 66 form a linear voltage divider for $V_{OUTM}$. This helps keep the input common-mode requirement for amplifiers 54 and 56 reasonable for large output swings of $V_{OUTP}$ and $V_{OUTM}$. The inputs $V_{INP}$ and $V_{INM}$ can be divided down in the same fashion, but with consequences such as noise degradation.

Although the present invention has been described in detail, it should be understood that various changes, substitutions and alterations can be made without departing from the spirit and scope of the invention as defined by the appended claims. It is therefore intended that the appended claims encompass any such modifications or embodiments.

What is claimed is:

1. A distortion correction circuit comprising:
   a main amplifier having a first resistor coupled between an output of the main amplifier and a first input of the main amplifier, and a second resistor coupled between the first input of the main amplifier and a first input signal node;
   a correction loop amplifier having an output coupled to a second input of the main amplifier, an output of the main amplifier coupled to a negative input of the correction loop amplifier, a positive input of the correction loop amplifier coupled to a second input signal node.

2. The circuit of claim 1 wherein the first input of the main amplifier is a negative input and the second input of the main amplifier is a positive input.

3. A differential distortion correction circuit comprising:
   a first main amplifier having a first resistor coupled between an output of the first main amplifier and a first input of the first main amplifier, a second resistor coupled between the first input of the first main amplifier and a first input signal node, and a third resistor coupled between a second input of the first main amplifier and a second input signal node;
   a first correction loop amplifier having an output coupled to the second input of the first main amplifier through a fourth resistor, the output of the first main amplifier coupled to a first input of the first correction loop amplifier, a second input of the first correction loop amplifier coupled to the second input signal node;
   a second main amplifier having a fifth resistor coupled between an output of the second main amplifier and a first input of the second main amplifier, a sixth resistor coupled between the first input of the second main amplifier and the second input signal node, and a seventh resistor coupled between a second input of the second main amplifier and the first input signal node;
   a second correction loop amplifier having an output coupled to the second input of the second main amplifier through an eighth resistor, the output of the second main amplifier coupled to a first input of the second correction loop amplifier, a second input of the first correction loop amplifier coupled to the first input signal node.

4. The circuit of claim 3 wherein the resistance values of the first, fourth, fifth, and eighth resistors are the same, and the resistance values of the second, third, sixth, and seventh resistors are twice that of the first resistor.

5. The circuit of claim 3 wherein the first input of the first main amplifier is a negative input, the second input of the first main amplifier is a positive input, the first input of the second main amplifier is a negative input, and the second input of the second main amplifier is a positive input.

6. The circuit of claim 3 wherein the first input of the first correction loop amplifier is a negative input, the second input of the first correction loop amplifier is a positive input, the first input of the second correction loop amplifier is a negative input, and the second input of the second correction loop amplifier is a positive input.

7. The circuit of claim 3 further comprising a ninth resistor coupled between the output of the first main amplifier and the first input of the first correction loop amplifier, a tenth resistor coupled between the first input of the first correction loop amplifier and a bias node, an eleventh resistor coupled between the output of the second main amplifier and the first input of the second correction loop amplifier, and a twelfth resistor coupled between the first input of the second correction loop amplifier and the bias node.

\* \* \* \* \*